United States Patent
Min

(10) Patent No.: US 7,244,632 B2
(45) Date of Patent: Jul. 17, 2007

(54) COMPLEMENTARY METAL OXIDE SEMICONDUCTOR IMAGE SENSOR AND METHOD FOR FABRICATING THE SAME

(75) Inventor: Wi Sik Min, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 16 days.

(21) Appl. No.: 10/901,384

(22) Filed: Jul. 29, 2004

(65) Prior Publication Data

US 2005/0139752 A1   Jun. 30, 2005

(30) Foreign Application Priority Data

Dec. 30, 2003   (KR) .................. 10-2003-0100950

(51) Int. Cl.
*H01L 21/00*   (2006.01)
(52) U.S. Cl. .................. 438/57; 438/73; 438/294; 438/526; 257/E31.001
(58) Field of Classification Search .......... 438/48–98, 438/510–532, 141–308; 257/E31.001
See application file for complete search history.

(56) References Cited

U.S. PATENT DOCUMENTS

| | | | | |
|---|---|---|---|---|
| 5,410,175 | A | * | 4/1995 | Kyomasu et al. ......... 257/458 |
| 5,747,860 | A | * | 5/1998 | Sugiyama et al. ......... 257/432 |
| 6,001,667 | A | * | 12/1999 | Saitoh et al. .............. 438/57 |
| 6,008,506 | A | * | 12/1999 | Morikawa ................ 257/85 |
| 6,211,509 | B1 | | 4/2001 | Inoue et al. |
| 6,380,037 | B1 | * | 4/2002 | Osanai .................... 438/294 |
| 6,448,614 | B2 | * | 9/2002 | Kubo et al. .............. 257/347 |
| 6,462,360 | B1 | * | 10/2002 | Higgins et al. ........... 257/189 |
| 7,041,525 | B2 | * | 5/2006 | Clevenger et al. ........ 438/48 |

(Continued)

FOREIGN PATENT DOCUMENTS

JP       63-093149       4/1988

OTHER PUBLICATIONS

Search Report from the European Patent Office, dated Jun. 9, 2006, in counterpart European Patent Application No. 04016939.3-2203.

*Primary Examiner*—Savitri Mulpuri
(74) *Attorney, Agent, or Firm*—Finnegan, Henderson, Farabow, Garrett & Dunner, L.L.P.

(57) ABSTRACT

A complementary metal oxide semiconductor image sensor and a method for fabricating the same are disclosed, wherein a width of a depletion area of a photodiode is varied by variably applying a back bias voltage to a semiconductor substrate without using any color filter, thereby preventing a back bias voltage from influencing a transistor formed on the outside of a photodiode in a CMOS image sensor sensing optical color sensitivity of light rays irradiated to the photodiode. The CMOS image sensor includes a first conductive semiconductor substrate having a first region for forming a photodiode and a second region for forming transistors and having a back bias voltage for varying a width of a depletion area in the first region applied thereon, a plurality of transistors formed in the second region of the semiconductor substrate, a photodiode formed in the first region of the semiconductor substrate, a second conductive buried layer formed in the second region of the semiconductor substrate, so as to prevent the back bias voltage from influencing the transistors, and a first isolating barrier formed within the semiconductor substrate, so as to surround a side portion of the second region.

6 Claims, 13 Drawing Sheets

U.S. PATENT DOCUMENTS

2002/0036303 A1* 3/2002 Ohkubo ................. 257/215
2003/0127667 A1   7/2003 Inoue et al.
2004/0180485 A1* 9/2004 Beasom ................. 438/197
2005/0145904 A1* 7/2005 Min ..................... 257/292

* cited by examiner

COMPLEMENTARY METAL OXIDE SEMICONDUCTOR IMAGE SENSOR AND METHOD FOR FABRICATING THE SAME

CROSS-REFERENCE TO RELATED APPLICATIONS

This application claims the benefit of Korean Application No. P2003-100950, filed on Dec. 30, 2003, which is hereby incorporated by reference as if fully set forth herein.

BACKGROUND OF THE INVENTION

1. Field of the Invention

The present invention relates to an image sensor, and more particularly, to a complementary metal oxide semiconductor (CMOS) image sensor and a method for fabricating the same. Although the present invention is suitable for a wide scope of applications, it is particularly suitable for preventing a back bias voltage from influencing a transistor formed on the outside of a photodiode in a CMOS image sensor sensing optical color sensitivity of the colors of red, green, and blue, which are included in light rays irradiated to the photodiode, without using any color filters.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor (CIS).

The charge coupled device (CCD) includes a plurality of photodiodes (PD) aligned in a matrix form and converting light signals into electric signals, a plurality of vertical charge coupled devices (VCCD) formed between each vertical photodiode aligned in a matrix form and vertically transmitting electric charges generated from each photodiode, a horizontal charge coupled device (HCCD) horizontally transmitting the electric charges transmitted by each of the vertical charged couple devices (VCCD), and a sense amplifier sensing and outputting the horizontally transmitted electric charges.

However, the charged couple device (CCD) has the disadvantages of a complicated driving method, high power consumption, and a complicated fabrication process requiring a multi-phased photo process. Also, in the charge coupled device (CCD), a control circuit, a signal processing circuit, an analog to digital (A/D) converter circuit, and so on cannot be easily integrated into a charge coupled device chip, thereby having the problem of forming compact size products.

Recently, the complementary metal oxide semiconductor (CMOS) image sensor has been considered to be the next generation image sensor that can resolve the problems and disadvantages of the charge coupled device (CCD). The CMOS image sensor is a device adopting a CMOS technology using the control circuit, the signal processing circuit, and so on as a peripheral circuit, so as to form MOS transistors corresponding to the number of unit pixels on a semiconductor substrate, in order to sequentially detect the electric signals of each unit pixel by using a switching method, thereby representing an image.

Since the CMOS image sensor uses a CMOS fabrication technology, the CMOS image sensor is advantageous in that it has low power consumption and has a simple fabrication method through less photo process steps. Also, in the CMOS image sensor, a control circuit, a signal processing circuit, an A/D converter circuit, and so on can be integrated in a CMOS image sensor chip, thereby enabling the product to be fabricated in a compact size. Accordingly, the CMOS image sensor is currently being extensively used in various applied technologies, such as digital still cameras and digital video cameras.

A general CMOS image sensor will now be described with reference to the accompanying drawings.

FIG. 1 illustrates a schematic view of an equivalent circuit of one unit pixel in a general CMOS image sensor, and FIG. 2 illustrates a cross-sectional view of a related art CMOS image sensor.

Referring to FIG. 1, a unit pixel of a general CMOS image sensor is formed of one photodiode (PD) and three nMOS transistors (T1, T2, and T3). A cathode of the photodiode (PD) is integrated to a drain of a first nMOS transistor (T1) and a gate of a second NMOS transistor (T2). And, the sources of both first and second nMOS transistors (T1 and T2) are connected to a power line supplying a reference voltage (VR). The gate of the first nMOS transistor (T1) is connected to a reset line providing a reset signal (RST). Also, a source of a third NMOS transistor (T3) is connected to the drain of the second nMOS transistor (T2), the drain of the third nMOS transistor (T3) is connected to a reading circuit (not shown) through a signal line, and the gate of the third nMOS transistor (T3) is connected to a column select line providing a select signal (SLCT). Therefore, the first NMOS transistor (T1) is referred to as the reset transistor, the second nMOS transistor (T2) is referred to as a driving transistor, and the third nMOS transistor (T3) is referred to as a selecting transistor.

The structure of the CMOS image sensor will now be described in detail.

Referring to FIG. 2, a p-type epitaxial layer 11 having an active area and a field area defined thereon is formed on a p-type semiconductor substrate 10, and a field insulating laser (not shown) is formed in the field area. In the active area, an isolating barrier 13 is formed between a first region for forming the photodiode and a second region for forming the transistors. And, an n-type diffusion area is formed by ion injecting n-type impurities in the first region for forming the photodiode (PD) of the active area.

In addition, a gate electrode (G) and a gate insulator (GI) are formed in the second region of the p-type epitaxial layer 11. And, a source/drain (S/D) area is formed by ion-injecting impurities in the p-type epitaxial layer 11 on both sides of the gate electrode (G), thereby forming the transistor (TR). A transparent interlayer dielectric 17 is formed on an entire surface of the substrate including the photodiode (PD) and the transistor (TR). A color filter layer 18 is formed on the interlayer dielectric 17 formed above the photodiode (PD). A planarization layer 19 is formed on the interlayer dielectric 17 including the color filter layer 18. Then, a micro lens 21 is formed on the planarization layer 19 formed above the photodiode (PD).

Herein, the transistor (TR) is formed in an optical electric charge transmitter transmitting optical electric charges generated from the photodiode (PD). In the related art, only two transistors are aligned on the substrate 10 for simplicity, however, it is obvious to a person skilled in the art that a plurality of transistors is aligned on the substrate. Also, the semiconductor substrate 10 is formed of a p-type polycrystalline silicon substrate, and the color filter layer 18 is formed of photosensitive layers using red, green, and blue color dyes.

Generally, in the CMOS image sensor having the above-described structure, the color filter layer 18 is sequentially formed on the interlayer dielectric 17. More specifically, the photosensitive layer using a red color dye is coated by using a spin-coating process, exposed to light, and developed. The developed photosensitive layer is then remained on the color filter forming area in the interlayer dielectric 17, which is perpendicular to the photodiode (PD), and the photosensitive layer in the other areas is removed, thereby forming the color filter layer. By repeating the above-described method, the red, green, and blue color filter layers 18 are formed.

Therefore, in the related art, in order to form red, green, and blue color filter layers 18 having a color filter array, the coating, exposing, and developing processes should each be repeated three times, which not only complicates the fabrication process of the color filter array but also prevents the transmissivity of the red, green, and blue light rays each passing through the color filer layer from being uniformly maintained.

Recently, in order to resolve such problems of the color filter array, many alternative methods of sensing each of the red, green, and blue light rays without using the color filter have been proposed. Among the proposed methods, a method of using a micro prism is disclosed in the Korean Patent Application No. 10-2003-0056096. Also, a method of using a multiple slits is disclosed in the Korean Patent Application No. 10-2002-0039454: However, in the above-referenced methods, the fabrication processes of the micro prism and the multiple slits are very complicated and have many limitations in essentially resolving the problem of the complicated fabrication process of the CMOS image sensor.

SUMMARY OF THE INVENTION

Accordingly, the present invention is directed to a CMOS image sensor and a method for fabricating the same that substantially obviate one or more problems due to limitations and disadvantages of the related art.

An object of the present invention is to provide a CMOS image sensor and a method for fabricating the same that can easily sense red, green, and blue light rays by using a method of calculating a color sensitivity of red, green, and blue in accordance with an optical wave within a depletion area, wherein the width of the depletion area of the photodiode is varied by variably applying a back bias voltage to a semiconductor substrate without using the color filter.

Another object of the present invention is to provide a CMOS image sensor and a method for fabricating the same that can minimize the influence of a back bias voltage on a device on an outer side of the photodiode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a complementary metal oxide semiconductor (CMOS) image sensor including a first conductive semiconductor substrate having a first region for forming a photodiode and a second region for forming transistors and having a back bias voltage for varying a width of a depletion area in the first region applied thereon, a plurality of transistors formed in the second region of the semiconductor substrate, a photodiode formed in the first region of the semiconductor substrate, a second conductive buried layer formed in the second region of the semiconductor substrate, so as to prevent the back bias voltage from influencing the transistors, and a first isolating barrier formed within the semiconductor substrate, so as to surround a side portion of the second region.

Herein, the buried layer is formed of one of a U-shaped form and a horizontal linear form.

The U-shaped buried layer includes a first buried layer being formed horizontally, and a second buried layer formed between both side ends of the first buried layer and the isolating barrier.

The CMOS image sensor further includes a second isolating barrier formed within the semiconductor substrate, so as to surround a side portion of the first region.

The first isolating barrier of the side portion in the second region is formed of a conductive layer, and the second isolating barrier of the side portion in the first region is formed of an insulating layer.

Also, the first isolating barrier and the second isolating barrier are both formed of an insulating layer.

In another aspect of the present invention, a method for fabricating a complementary metal oxide semiconductor (CMOS) image sensor includes preparing a first conductive semiconductor substrate having a first region for forming a photodiode and a second region for forming transistors defined thereon, forming a first buried layer of a second conductive type formed to have a predetermined depth in the second region of the semiconductor substrate, forming a first trench in a region of the semiconductor substrate corresponding to an area surrounding the second region, and forming a second trench in a region of the semiconductor substrate corresponding to an area surrounding the first region, forming a second buried layer on the semiconductor substrate between the first trench and the first buried layer, forming an isolating barrier on the first trench and the second trench, and forming a photodiode in the first region of the semiconductor substrate, and forming a transistor in the second region of the semiconductor substrate.

Herein, the method for fabricating the CMOS image sensor further includes forming an interlayer dielectric on the semiconductor substrate including the transistor, forming a planarization layer on the interlayer dielectric, and forming a micro lens on the planarization layer, so as to be located on a horizontal line of the photodiode.

In a further aspect of the present invention, a method for fabricating a complementary metal oxide semiconductor (CMOS) image sensor includes preparing a first conductive semiconductor substrate having a first region for forming a photodiode and a second region for forming transistors defined thereon, forming a buried layer of a second conductive type formed to have a predetermined depth in the second region of the semiconductor substrate, forming a trench in a region of the semiconductor substrate corresponding to an area surrounding the second region, forming an isolating barrier on the trench, and forming a photodiode in the first region of the semiconductor substrate, and forming a transistor in the second region of the semiconductor substrate.

Therefore, by applying the back bias voltage to the semiconductor substrate, the width of the depletion area of the photodiode can be varied without having the back bias voltage influence the transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The complementary metal oxide semiconductor (CMOS) image sensor according to the present invention does not use any of the structures, such as the color filter layer, the micro prism, and the multiple slits. Instead, by varying the width of the depletion area of the photodiode by a variation of the back bias voltage (Vb) of the semiconductor device, the CMOS image sensor according to the present invention can sense the color sensitivity of the red, green, and blue color light rays, and the back bias voltage (Vb) does not influence other parts of the device apart from the photodiode.

Accordingly, a CMOS image sensor and a method for fabricating the same that can sense the color sensitivity of red, green, and blue light rays by varying the width of the depletion area of the photodiode through a variation in the back bias voltage (Vb) of the semiconductor device, without using any of the structures such as color filter layer, the micro prism, and the multiple slits, has been disclosed earlier (see Our Ref. No.: OPP-GZ-2004-0002-US-00).

The above-mentioned CMOS image sensor and the method for fabricating the same will now be described.

Figure 1:
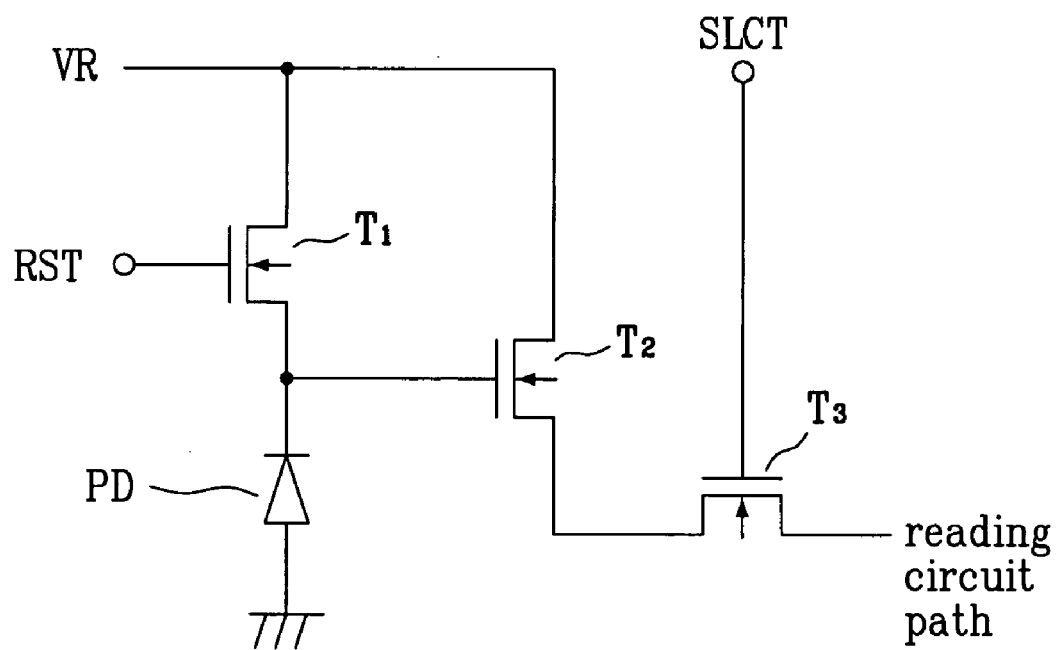
FIG. 1 illustrates a schematic view of an equivalent circuit of a unit pixel in a general CMOS image sensor.
Figure 2:
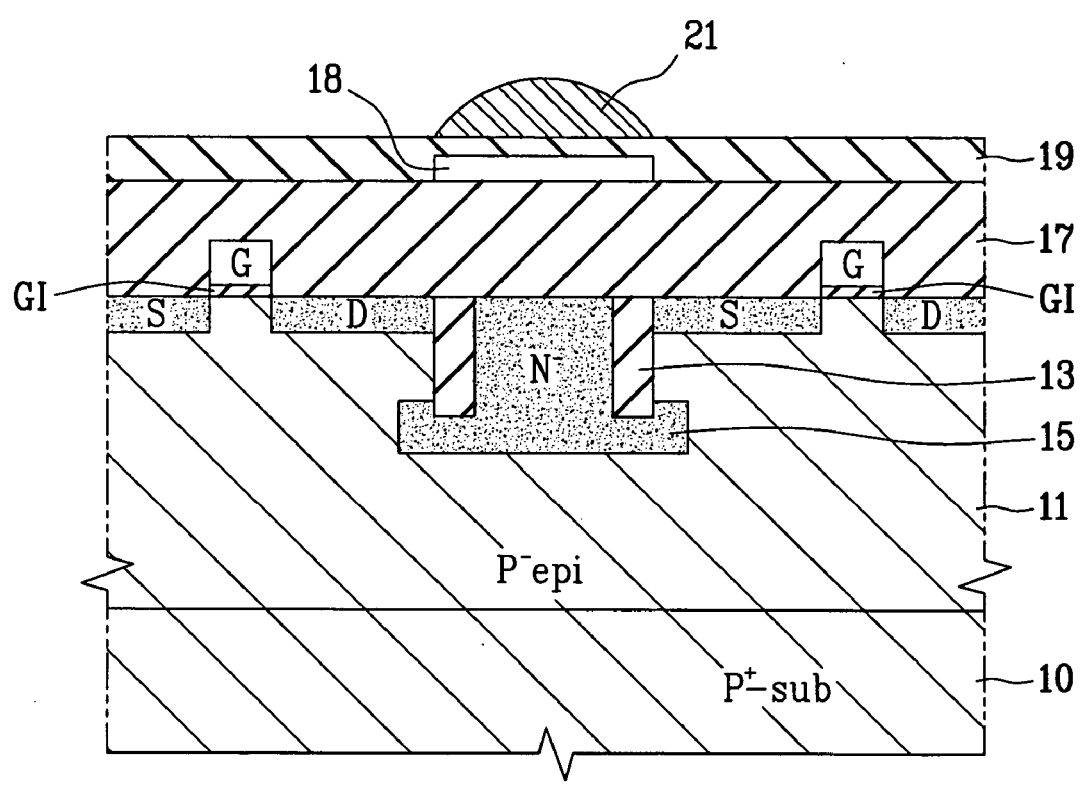
FIG. 2 illustrates a cross-sectional view of a related art CMOS image sensor.
Figure 3:
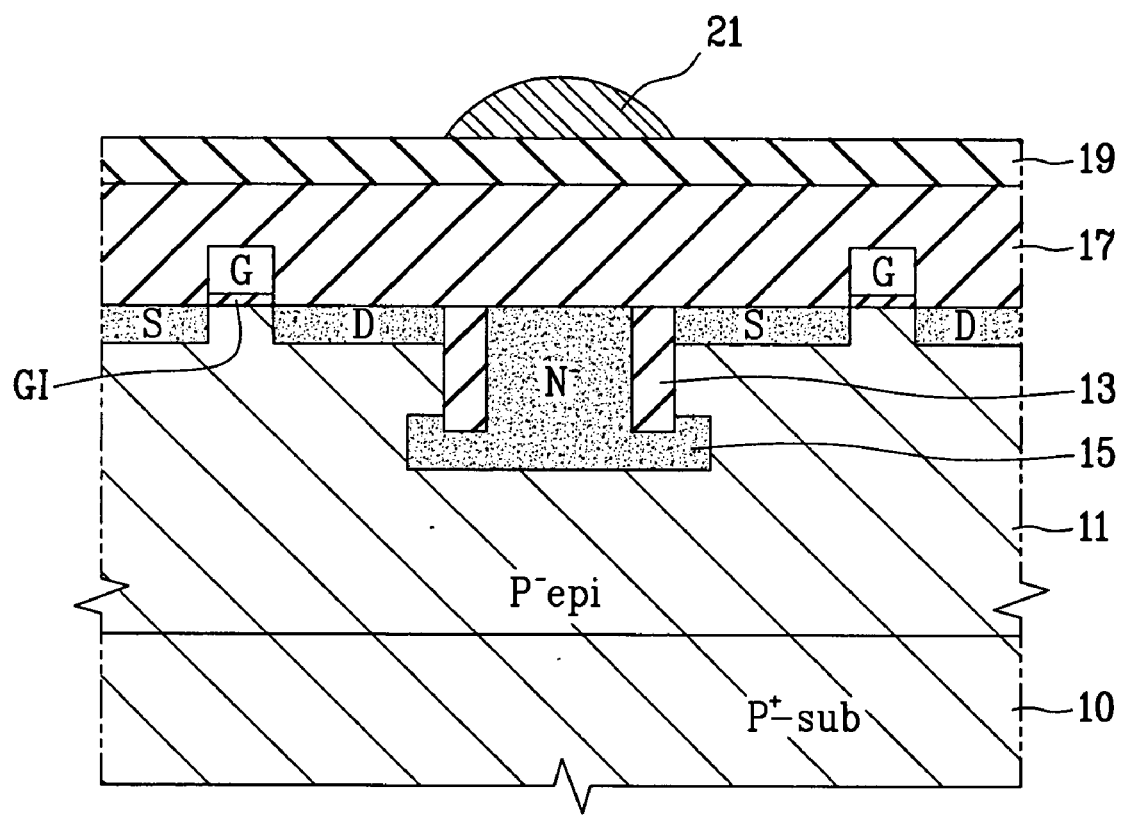
FIG. 3 illustrates a cross-sectional view of a CMOS image sensor according to a first embodiment of the present invention.

FIG. 3 illustrates a cross-sectional view of a CMOS image sensor according to a first embodiment of the present invention, which is disclosed in Our Ref. No.: OPP-GZ-2004-0002-US-00.

Referring to FIG. 3, a p-type epitaxial layer 11 is formed on a semiconductor substrate 10, such as a (p+)-type silicon substrate. An isolating barrier 13 is formed between a first region for forming a photodiode and a second region for forming transistors of the p-type epitaxial layer 11. An (n−)-type diffusion area 15 for the photodiode (PD) is formed in the first region of the p-type epitaxial layer 11. A source/drain (S/D) area and a gate electrode (G) for the transistor (TR) are formed in the second region of the p-type epitaxial layer 11. A transparent interlayer dielectric 17 is formed on the photodiode (PD) and the transistor (TR). A planarization layer 19 is formed on the interlayer dielectric 17. And, a micro lens 21 is formed on the planarization layer 19, so as to be formed on the perpendicular line of the photodiode (PD).

Herein, the transistor (TR) includes an optical electric charge transmitter transmitting optical electric charge generated from the photodiode (PD), and an optical color sensitivity calculating unit sensing optical colors of red, green, and blue from the light ray irradiated to the photodiode. In the present invention, only two transistors are aligned on the substrate 10 for simplicity, however, it is obvious to a person skilled in the art that a plurality of transistors is aligned on the substrate.

In the above-described CMOS image sensor according to the first embodiment of the present invention, by varying and applying a back bias voltage (Vb) to a rear surface of the semiconductor substrate 10, the depletion area of the photodiode (PD) is varied, and by using such variation, the optical color sensitivity of red, green, and blue including in the light ray irradiated on the photodiode can be sensed.

However, the back bias voltage can also be applied to the transistor (TR) forming the optical electric charge transmitter and the optical color sensitivity calculator, thereby changing the electrical characteristics of the transistor (i.e., threshold voltage, etc.). As a result, the optical color sensitivity of red, green, and blue cannot be accurately sensed. Therefore, the back bias voltage should be controlled, so that the back bias voltage does not influence devices (or transistors) other than the photodiode. The second and third embodiments of the present invention have been devised so that the back bias voltage does not influence devices (or transistors) other than the photodiode.

Figure 4:
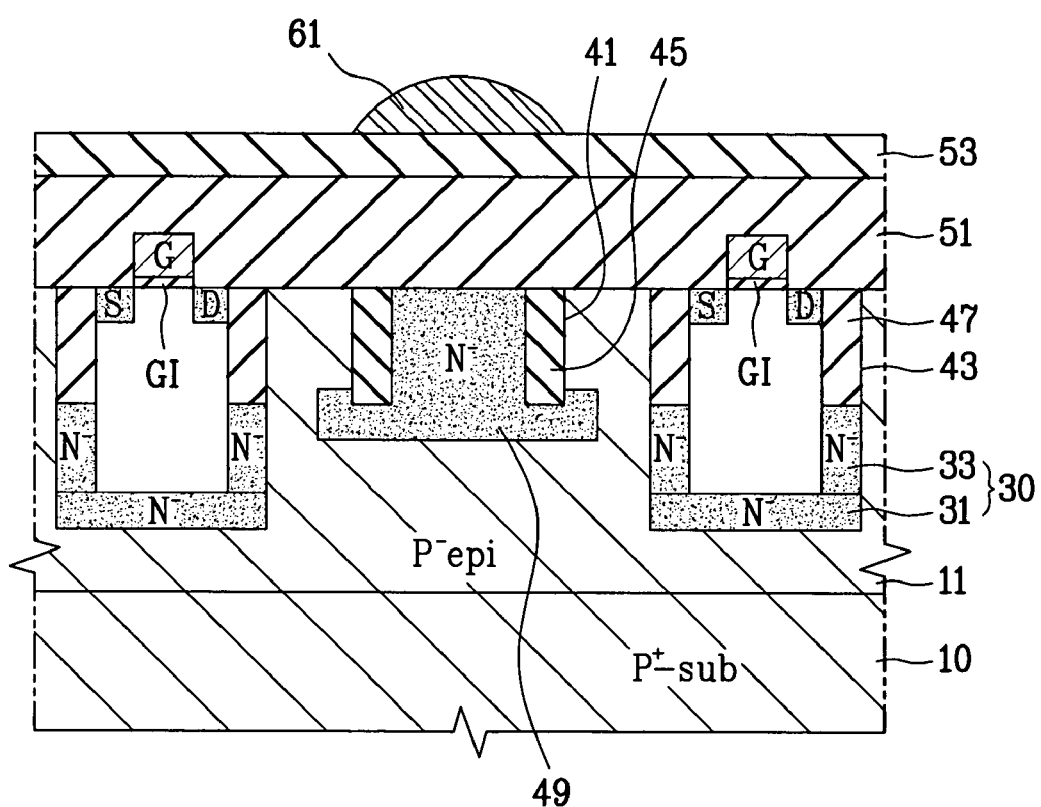
FIG. 4 illustrates a cross-sectional view of a CMOS image sensor according to a second embodiment of the present invention.

FIG. 4 illustrates a cross-sectional view of a CMOS image sensor according to a second embodiment of the present invention.

Referring to FIG. 4, in the CMOS image sensor according to the present invention, a p-type epitaxial layer 11 is formed on a semiconductor substrate 10, such as a polycrystalline silicon substrate of a first conductive type (e.g., (p−)-type). And, a low concentration buried layer 30 of a second conductive type (e.g., (n−)-type) is formed to have a U-shaped form of a predetermined depth in the second region of the p-type epitaxial layer 11. The U-shaped (n−)-type buried layer 30 includes a horizontally formed first buried layer 31 and a second buried layer 33 formed perpendicularly formed at both ends of the first buried layer 31 and connected to the first buried layer 31.

Also, a first trench 41 is formed to surround the side portion of the first region for forming the photodiode in the p-type epitaxial layer 11. And, a second trench 43 having the same depth as the first trench 41 is formed to surround the side portion of the second region for forming the transistors in the p-type epitaxial layer 11. At this point, the second trench 43 is formed above the second buried layer 33. An isolating barrier 45 formed of an insulating layer is formed within the first trench 41, and a conductive layer 47 (e.g., a polycrystalline silicon layer or a metal layer) is formed within the second trench 43.

Additionally, an (n−)-type diffusion area 49 for the photodiode (PD) is formed in the first region of the p-type epitaxial layer 11. A gate electrode (G) and a gate insulating layer (GI) of the transistor (TR) are formed on the p-type epitaxial layer 11 in the second region. And, a source/drain (S/D) area is formed at both sides of the gate electrode (G) of the p-type epitaxial layer 11 by an n-type impurity injection. Herein, the (n−)-type diffusion area 49 for the photodiode (PD) is formed to have depth smaller than that of the first buried layer 33.

Furthermore, a transparent interlayer dielectric 51 is formed on the entire surface of the p-type epitaxial layer 11 including the gate electrode (G). Then, a planarization layer 53 is formed on the interlayer dielectric 51, and a micro lens 21 is formed on the planarization layer 53, so as to be formed on the perpendicular line of the (n−)-type diffusion area 49. Herein, the interlayer dielectric 51 is formed to have a single layer, however, the interlayer dielectric 51 can also be formed of a transparent multi-layer. Also, also contact holes or metal wires of the transistor are omitted in the drawings, it is obvious to a person skilled in the art that the contact holes or the metal wires actually exist.

In the above-described CMOS image sensor according to the second embodiment of the present invention, the back bias voltage (Vb) is applied to the Tear surface of the semiconductor substrate 10. The back bias voltage (Vb) applied to the rear surface of the semiconductor substrate 10 passes through the p-type epitaxial layer 11, so as to be applied to the (n−)-type diffusion area 49. Accordingly, when the back bias voltage is varied, the width of the depletion area (not shown) in the (n−)-type diffusion area 49 is also varied. At this point, the buried layer 30 isolates the transistor, thereby minimizing the electrical influence of the back bias voltage (Vb) to the source/drain (S/D) area of the transistor.

Therefore, the CMOS image sensor according to the second embodiment of the present invention can prevent the change in the characteristics of devices such as the transistors including the optical electric charge transmitter, the optical color sensitivity calculator, and so on, which are formed on an outer side of the first region, and can also sense the optical color sensitivity of red, green, and blue included in the light rays irradiated to the (n−)-type diffusion area 49. Herein, the method of sensing the optical color sensitivity has very little relation with the present invention, and a detailed description of the same will, therefore, be omitted.

Figure 5:
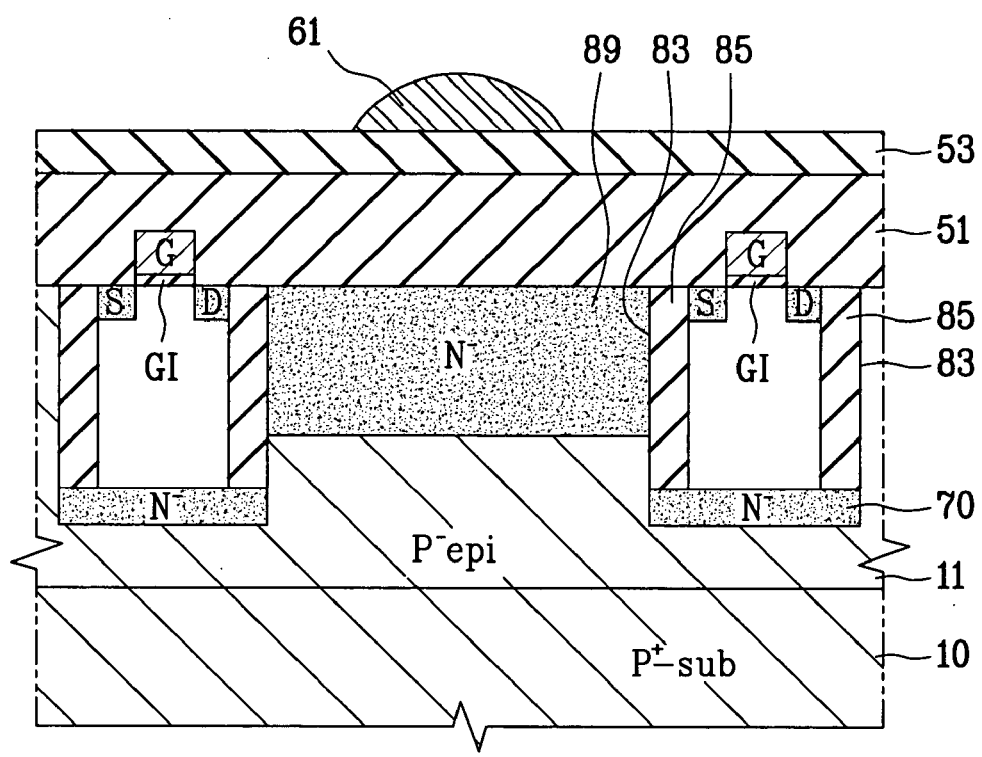
FIG. 5 illustrates a cross-sectional view of a CMOS image sensor according to a third embodiment of the present invention.

FIG. 5 illustrates a cross-sectional view of a CMOS image sensor according to a third embodiment of the present invention.

Referring to FIG. 5, in the CMOS image sensor according to the present invention, a p-type epitaxial layer 11 is formed on a semiconductor substrate 10, such as a polycrystalline silicon substrate of a first conductive type (e.g., (p−)-type). And, a buried layer 30 of a second conductive type (e.g., (n−)-type) is horizontally formed to have a predetermined depth in the second region for forming the transistors of the p-type epitaxial layer 11. A trench 83 is formed to surround the side portion of the second region in the p-type epitaxial layer 11. And, an isolating barrier 85 formed of an insulating layer is formed inside the trench 83. Herein, the trench 83 is formed to contact both sides of the (n−)-type buried layer 70.

Additionally, an (n−)-type diffusion area 89 for the photodiode (PD) is formed in the first region for forming the photodiode of the p-type epitaxial layer 11. A gate electrode (G) and a gate insulating layer (GI) are formed on the p-type epitaxial layer 11 in the second region. And, a source/drain (S/D) area for the transistor is formed at both sides of the gate electrode (G) of the p-type epitaxial layer 11. Herein, the (n−)-type diffusion area 89 is formed to have depth smaller than that of the (n−)-type buried layer 70.

Furthermore, a transparent interlayer dielectric 51 is formed on the entire surface of the semiconductor substrate 10 including the gate electrode (G). Then, a planarization layer 53 is formed on the interlayer dielectric 51, and a micro lens 21 is formed on the planarization layer 53, so as to be formed on the perpendicular line of the (n−)-type diffusion area 49.

In the above-described CMOS image sensor according to the third embodiment of the present invention, the back bias voltage (Vb) is applied to the rear surface of the semiconductor substrate 10. The back bias voltage (Vb) applied to the rear surface of the semiconductor substrate 10 passes through the p-type epitaxial layer 11, so as to be applied to the (n−)-type diffusion area 89. Accordingly, when the back bias voltage is varied, the width of the depletion area (not shown) in the (n−)-type diffusion area 89 is also varied. At this point, the buried layer 70 and the isolating barrier 85 isolate the transistor, thereby minimizing the electrical influence of the back bias voltage (Vb) to the source/drain (S/D) area of the transistor.

Therefore, the CMOS image sensor according to the third embodiment of the present invention can prevent the change in the characteristics of devices such as the transistors including the optical electric charge transmitter, the optical color sensitivity calculator, and so on, which are formed on an outer side of the first region, and can also sense the optical color sensitivity of red, green, and blue included in the light rays irradiated to the (n−)-type diffusion area 89. Herein, the method of sensing the optical color sensitivity has very little relation with the present invention, and a detailed description of the same will, therefore, be omitted.

Also, in the CMOS image sensor according to the third embodiment of the present invention, one trench is aligned between the first region for forming the photodiode and the second region for forming the transistors. Therefore, the surface area of the unit cell of the CMOS image sensor according to the third embodiment of the present invention can be reduced as compared to the surface area of the CMOS image sensor according to the second embodiment of the present invention, wherein two trenches are aligned between the first region and the second region.

The methods for fabricating the CMOS image sensors according to the second and third embodiment of the present invention will now be described in detail.

FIGS. 6A to 6E illustrate cross-sectional views showing the process steps of fabricating the CMOS image sensor of FIG. 4.

Figure 6A:
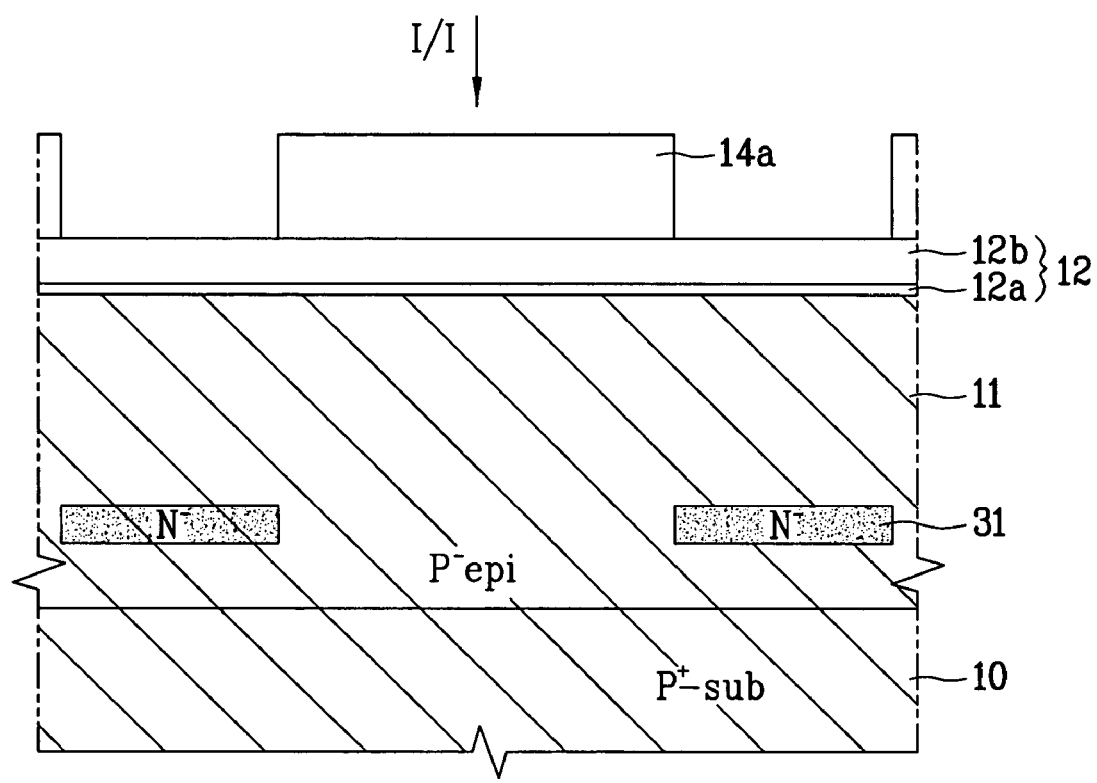
FIGS. 6A to 6E illustrate cross-sectional views showing the process steps of fabricating the CMOS image sensor of FIG. 4.

In the method for fabricating the CMOS image sensor according to the second embodiment of the present invention, the p-type epitaxial layer 11 is grown on the semiconductor layer 10 of the first conductive (or p-type), as shown in FIG. 6A. Subsequently, a sacrifice layer 12 having a multi-layered structure of a pad oxide layer 12a and a pad nitride layer 12b is formed on the p-type epitaxial layer 11. Herein, the pad nitride layer 12b acts as a hard mask layer in a shallow trench isolation (STI) process that will follow and also acts as an etch-stop layer in a chemical mechanical polishing (CMP) process.

Thereafter, a first photosensitive layer 14a is deposited on the sacrifice layer 12, which is then patterned through an exposure and development process, so as to open the second region. Then, the first photosensitive layer 14a is used as a mask to ion-inject n-type impurities to the p-type epitaxial layer 11 by using a high energy of about 1 MeV, thereby forming a first buried layer 31 of an n-type having a predetermined depth in the second region of the p-type epitaxial layer 11. Herein, the first buried layer 31 is extendedly formed in a horizontal direction. At this point, the first buried layer 31 can also be formed by injecting n-type impurity ions at a high energy of about 1 MeV without using the photosensitive mask. Then, the p-type impurities can be counter doped, so as to recover the first region.

Figure 6B:
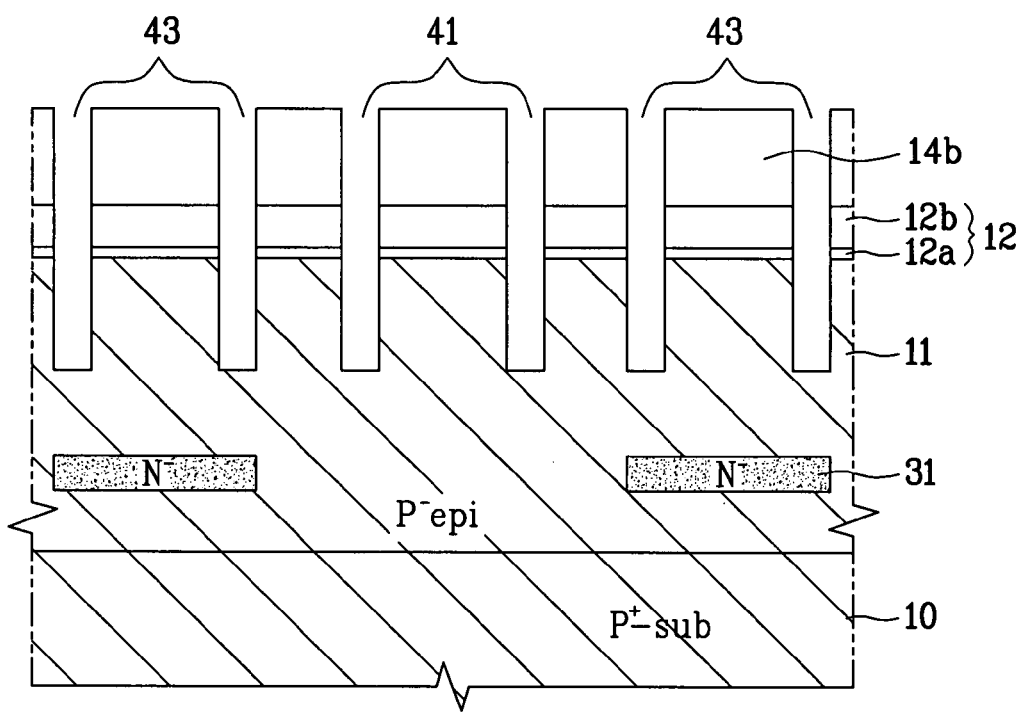

Referring to FIG. 6B, the first photosensitive layer 14a is removed, and a second photosensitive layer 14b is deposited on the entire surface. Then, after an exposure and development process, the second photosensitive layer 14b is patterned so as to expose the sacrifice layer 12 on the side portion of the first region and the side portion of the second region.

Subsequently, the second photosensitive layer 14b is used as a mask to selectively remove the sacrifice layer 12 and the p-type epitaxial layer 11, so as to form a first trench 43 surrounding the side portion of the second region in the p-type epitaxial layer 11, and to form a second trench 41 surrounding the side portion of the first region in the p-type epitaxial layer 11. At this point, each of the first and second trenches 43 and 41 is formed to have a depth smaller than that of the first buried layer 31.

Figure 6C:
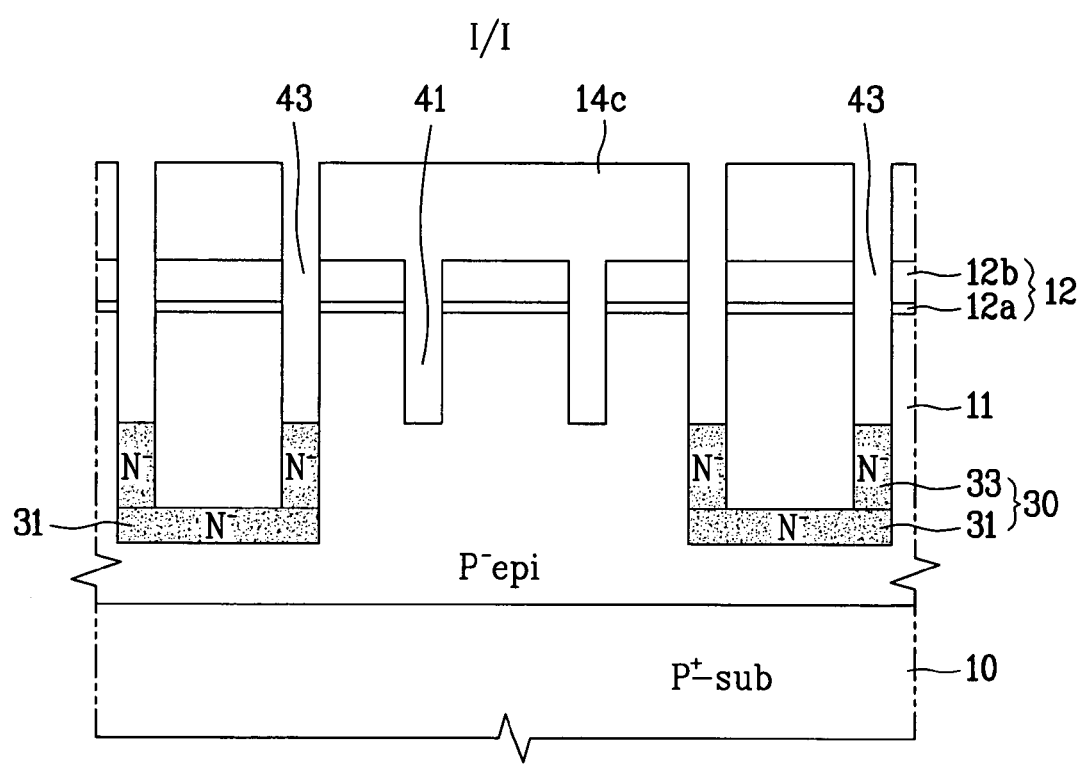

Referring to FIG. 6C, the second photosensitive layer 14b is removed, and a third photosensitive layer 14c is deposited on the entire surface. The third photosensitive layer 14c is then patterned through an exposure and development process, so as to expose the first trench 43 area. Thereafter, n-type impurity ions are ion-injected to the p-type epitaxial layer 11 at the lower portion of the first trench 43, thereby forming a second buried layer 33 between the first buried layer 31 and the first trench 43. At this point, the first and second buried layers 31 and 33 and the first trench 43 isolate the second region.

Figure 6D:
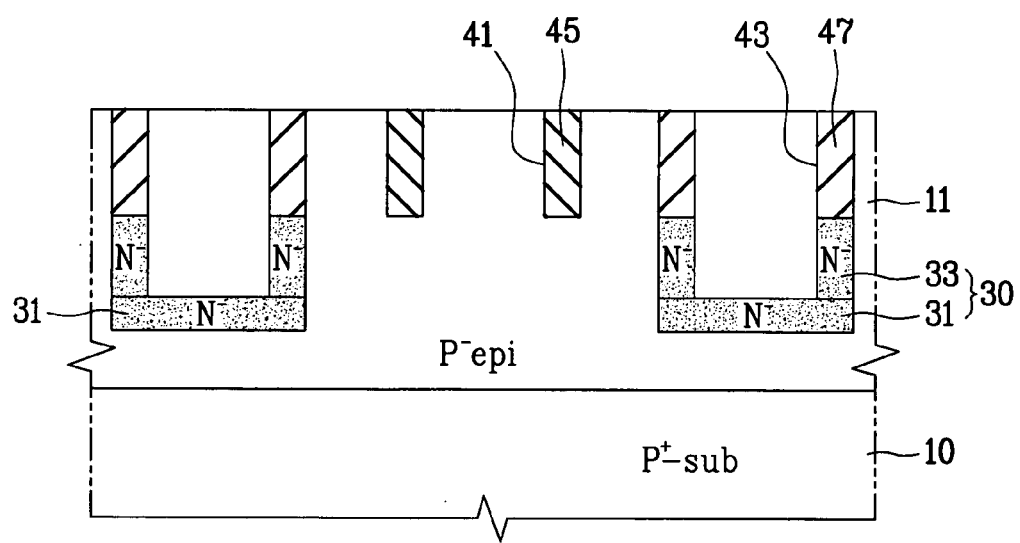

As shown in FIG. 6D, a conductive layer 47, such as a polycrystalline silicon layer or a metal layer, is deposited to fill the first trench 43, which is then planarized through a chemical mechanical polishing (CMP) process. Also, an insulating layer 45 such as an oxide layer is thickly deposited so as to fill the second trench 41, which is then planarized through a chemical mechanical polishing (CMP) process. Then, an isolating barrier is formed by using the same method.

At this point, an insulating layer such as an oxide layer is thickly formed on the sacrifice layer so as to fill the first and second trenches 41 and 43. By planarizing the insulating layer through the chemical mechanical polishing (CMP) process, an isolating barrier 45 and 47 can be formed in each of the first and second trenches 41 and 43. Meanwhile, the second buried layer 33 can also be formed after forming the isolating barriers 45 and 47.

Figure 6E:
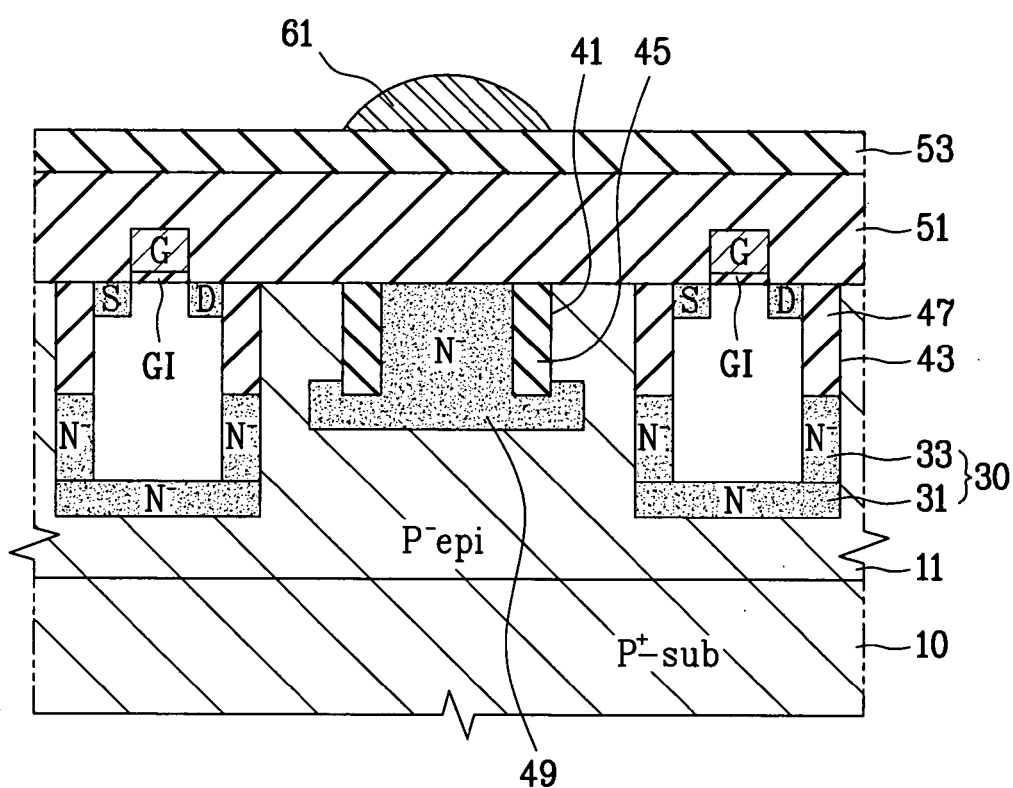

Referring to FIG. 6E, the sacrifice layer is removed, and by using an ordinary method, the (n−)-type diffusion area 49 for the photodiode is formed in the first region of the p-type epitaxial layer 11. The gate electrode (G) is formed on the gate insulating layer (GI), the gate insulating layer (GI) being formed on the p-type epitaxial layer 11. And, the source/drain (S/D) area is formed by ion-injecting impurities in the p-type epitaxial layer 11 at both sides of the gate electrode (G). At this point, the (n−)-type diffusion area 49 and the buried layer 30 should be sufficiently spaced apart from one another so that the (n−)-type diffusion area 49 and the buried layer 30 do not come into contact.

Thereafter, the interlayer dielectric 51 is formed on the entire surface of the p-type epitaxial layer 11 including the gate electrode (G) and the (n−)-type diffusion area 49. Then, the planarization layer 53 is formed on the interlayer dielectric 51. And, the micro lens 61 is formed on the planarization layer 53, so as to be formed on the perpendicular line of the (n−)-type diffusion area 49, thereby completing the method for fabricating the CMOS image sensor according to the second embodiment of the present invention.

Figure 7A:
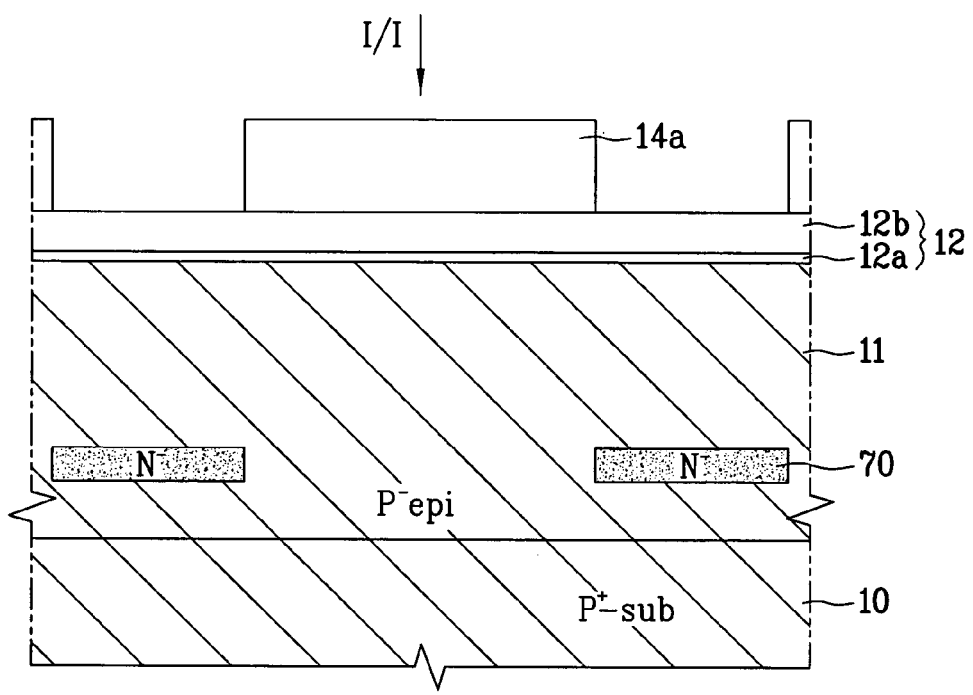
FIGS. 7A to 7C illustrate cross-sectional views showing the process steps of fabricating the CMOS image sensor of FIG. 5.
Figure 7B:
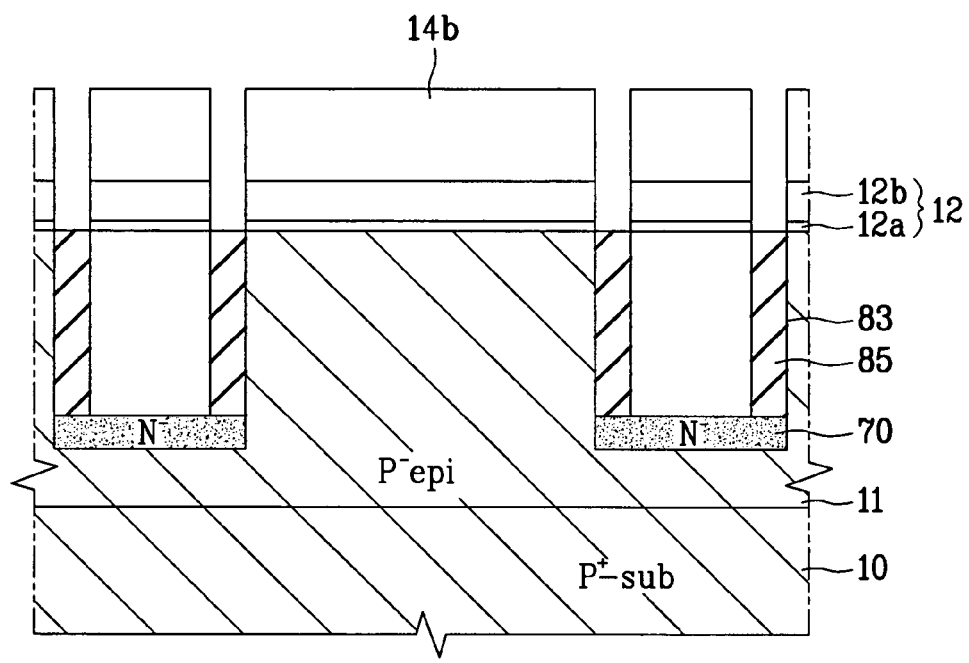
Figure 7C:
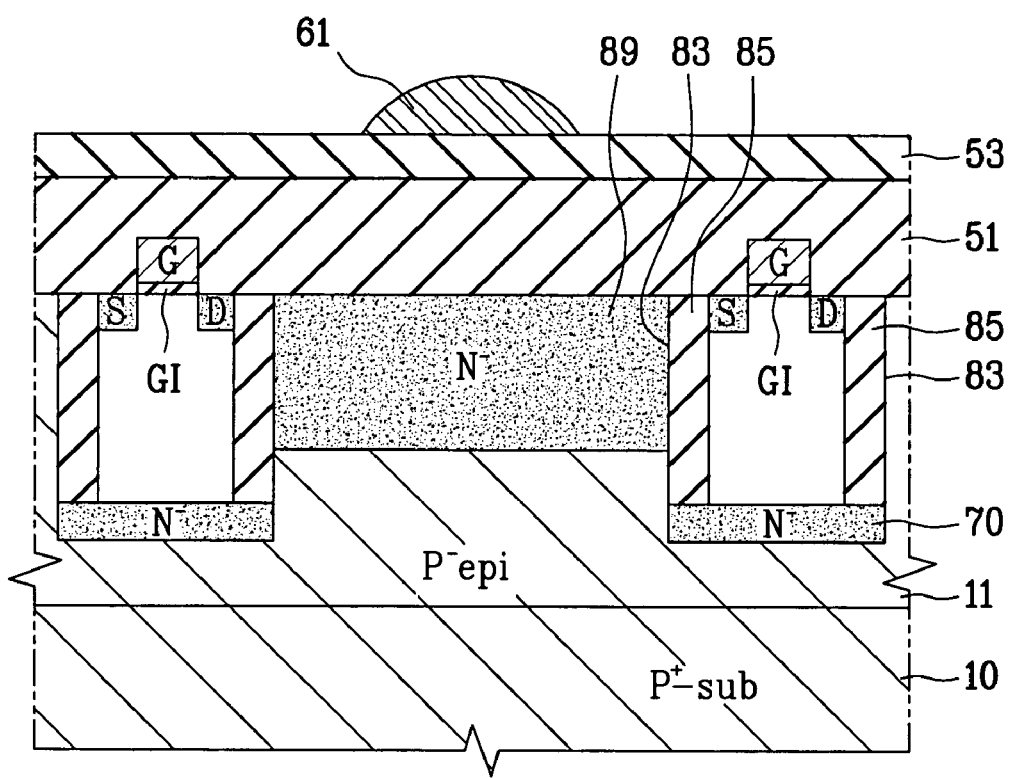

FIGS. 7A to 7C illustrate cross-sectional views showing the process steps of fabricating the CMOS image sensor of FIG. 5.

In the method for fabricating the CMOS image sensor according to the second embodiment of the present invention, the p-type epitaxial layer 11 is grown on the p-type semiconductor layer 10, as shown in FIG. 7A. Subsequently, a sacrifice layer 12 having a multi-layered structure of a pad oxide layer 12a and a pad nitride layer 12b is formed on the p-type epitaxial layer 11. Herein, the pad nitride layer 12b acts as a hard mask layer in a shallow trench isolation (STI) process that will follow and also acts as an etch-stop layer in a chemical mechanical polishing (CMP) process.

Thereafter, a first photosensitive layer 14a is deposited on the sacrifice layer 12, which is then patterned through an exposure and development process, so as to open the second region. Then, the first photosensitive layer 14a is used as a mask to ion-inject n-type impurities to the p-type epitaxial layer 11 by using a high energy of about 1 MeV, thereby forming an n-type buried layer 70 having a predetermined depth in the second region of the p-type epitaxial layer 11. Herein, the buried layer 70 is extendedly formed in a horizontal direction. At this point, the buried layer 70 can also be formed by injecting n-type impurity ions at a high energy of about 1 MeV without using the photosensitive mask. Then, the p-type impurities can be counter doped, so as to recover the first region.

Referring to FIG. 7B, the isolating barrier 85 formed of an insulating layer such as an oxide layer is formed by using the shallow trench isolation (STI) process. More specifically, the first photosensitive layer 14a is removed, and a second photosensitive layer 14b is deposited on the entire surface. Then, after an exposure and development process, the second photosensitive layer 14b is patterned so as to expose the sacrifice layer 12 on the side portion of the second region.

Subsequently, the second photosensitive layer 14b is used as a mask to selectively remove the sacrifice layer 12 and the p-type epitaxial layer 11, so as to form a trench 83 surrounding the side portion of the second region in a portion of the p-type epitaxial layer 11. At this point, the trench 83 is formed at a depth exposing each ends of the smaller than that of (n−)-type buried layer 70. Thereafter, an insulating layer such as an oxide layer is thickly deposited in the inside of the trench 83 and on the sacrifice layer 12 for gap-filling the trench 83. Then, by planarizing the insulating layer through the chemical mechanical polishing (CMP) process, the isolating barrier 85 is formed on the trench 83.

Therefore, since the trench is formed only in the area surrounding the second region in the method for fabricating the CMOS image sensor according to the third embodiment of the present invention, the degree of integration can be enhanced as compared to that of the second embodiment. And, since the process of forming the second buried layer is removed, the fabrication process is more simplified.

Referring to FIG. 7C, by using an ordinary method, the (n−)-type diffusion area 89 is formed in the first region of the p-type epitaxial layer 11. The gate electrode (G) is formed on the gate insulating layer (GI), the gate insulating layer (GI) being formed on the p-type epitaxial layer 11. And, the source/drain (S/D) area is formed in the p-type epitaxial layer 11 at both sides of the gate electrode (G).

Subsequently, the interlayer dielectric 51 is formed on the entire surface of the p-type epitaxial layer 11 including the gate electrode (G) and the (n−)-type diffusion area 89. Then, the planarization layer 53 is formed on the interlayer dielectric 51. And, the micro lens 61 is formed on the planarization layer 53, so as to be formed on the perpendicular line of the (n–)-type diffusion area 89, thereby completing the method for fabricating the CMOS image sensor according to the third embodiment of the present invention.

As described above, the CMOS image sensor and the method for fabricating the same according to the present invention has the following advantages.

A buried layer of an (n–)-type used for isolation is formed on a lower portion of a second region for forming transistors of a semiconductor substrate, an isolating barrier is formed on a side portion of a first region for forming a photodiode and a second region for forming transistors of the semiconductor substrate, and a photodiode and a transistor are respectively formed in the first and second regions of the semiconductor substrate. Therefore, without using a color filter layer, a back bias voltage is applied to the semiconductor layer, so as to vary the width of a depletion area of the photodiode, thereby sensing the optical color sensitivity of red, green, and blue light rays irradiated on the photodiode. Furthermore, since the buried layer and the isolating barrier isolate the transistor, the back bias voltage cannot influence the transistor, thereby allowing a more accurate sensing operation to be carried out.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a complementary metal oxide semiconductor (CMOS) image sensor, comprising:
    preparing a first conductive type semiconductor substrate having a first region for forming a photodiode and a second region for forming transistors defined thereon;
    implanting impurity ions into the second region of the semiconductor substrate to form a first buried layer of a second conductive type;
    forming a first trench in an area of the semiconductor substrate surrounding the second region, and forming a second trench in an area of the semiconductor substrate surrounding the first region;
    forming a photosensitive layer over the semiconductor substrate and patterning the photosensitive layer to expose the first trench;
    implanting impurity ions of the second conductive type into the semiconductor substrate through the exposed first trench to form a second buried layer between the first trench and the first buried layer;
    removing the patterned photosensitive layer;
    forming an isolating barrier in the first trench and the second trench; and
    forming a photodiode in the first region of the semiconductor substrate, and forming a transistor in the second region of the semiconductor substrate.

2. The method according to claim 1, further comprising:
    forming an interlayer dielectric on the semiconductor substrate including the transistor;
    forming a planarization layer on the interlayer dielectric; and
    forming a micro lens on the planarization layer, so as to be located above the photodiode.

3. The method according to claim 1, wherein the first trench and the second trench are formed to have a depth smaller than that of the first buried layer.

4. The method according to claim 1, wherein the isolating barrier is formed of an insulating layer.

5. The method according to claim 1, wherein the isolating barrier of the first trench is formed of a conductive layer, and the isolating barrier of the second trench is formed of an insulating layer.

6. The method according to claim 1, wherein a back bias voltage is applied to the semiconductor substrate for varying a width of a depletion area of the photodiode.

* * * * *